United States Patent
He et al.

(10) Patent No.: US 11,343,902 B2
(45) Date of Patent: May 24, 2022

(54) SYSTEM FOR PARALLEL COOLING OF COMPONENTS ON A CIRCUIT BOARD

(71) Applicant: Dell Products L.P., Round Rock, TX (US)

(72) Inventors: Qinghong He, Austin, TX (US); Man Tak Ho, Austin, TX (US); Arnold Thomas Schnell, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 16/923,760

(22) Filed: Jul. 8, 2020

(65) Prior Publication Data

US 2022/0015222 A1    Jan. 13, 2022

(51) Int. Cl.
*H05K 1/02* (2006.01)
*H05K 7/20* (2006.01)

(52) U.S. Cl.
CPC ....... *H05K 1/0209* (2013.01); *H05K 7/20154* (2013.01); *H05K 7/20309* (2013.01)

(58) Field of Classification Search
CPC ............. H05K 7/0209; H05K 7/20154; H05K 7/20309
See application file for complete search history.

(56) References Cited

U.S. PATENT DOCUMENTS

| | | | |
|---|---|---|---|
| 7,382,616 B2 * | 6/2008 | Stefanoski | G06F 1/20 165/104.33 |
| 7,684,187 B1 * | 3/2010 | Meyer, IV | H01L 23/467 361/679.47 |
| 2019/0132938 A1 * | 5/2019 | Mira | H01L 23/427 |

* cited by examiner

*Primary Examiner* — Mukundbhai G Patel
(74) *Attorney, Agent, or Firm* — Baker Botts L.L.P.

(57) ABSTRACT

A cooling system for cooling a set of components on a circuit board includes a vapor chamber for distributing heat over a larger surface area, a fan in a housing configured to direct a first airflow in a first direction to a first heatsink and direct a second airflow in a second direction opposite the first direction to a second heatsink. The heatsinks can have different sizes and the fan can be located relative to a midpoint of the vapor chamber or the circuit board or positioned relative to a component on the circuit board.

8 Claims, 6 Drawing Sheets

SYSTEM FOR PARALLEL COOLING OF COMPONENTS ON A CIRCUIT BOARD

BACKGROUND

Field of the Disclosure

This disclosure relates generally to information handling systems and, more particularly, to cooling systems for parallel cooling of components on a circuit board.

Description of the Related Art

As the value and use of information continues to increase, individuals and businesses seek additional ways to process and store information. One option available to users is information handling systems. An information handling system generally processes, compiles, stores, and communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Examples of information handling systems include servers, gaming systems, desktop computers, and other information handling systems. Generally, an information handling system is contained in a chassis with a set of fans generating airflow through the chassis to cool components.

SUMMARY

As information handling systems increase in complexity and performance capabilities, cooling the components and a chassis also increases in complexity. Some components generate heat at a low rate such that a fan generating an airflow through the chassis provides enough cooling of the components and the chassis. Other components generate heat at higher rates such that more airflow is necessary and/or the performance of the component must be reduced to reduce heat buildup in the chassis.

In one aspect, a disclosed cooling system for a set of components on circuit board in an information handling system includes a vapor chamber, a fan in a housing with two opposed outlets and a pair of heatsinks. A first heatsink is positioned near a first fan outlet and a second heatsink is positioned near a second fan outlet on an opposite side of the fan. Rotation of the fan in the housing generates two opposed airflows for parallel cooling of the two heatsinks.

The first heatsink may be smaller, the same size, or larger than the second heatsink. The fan may be positioned at the midpoint of the vapor chamber, at the midpoint of the circuit board, or relative to a component on the circuit board to facilitate heat transfer.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes and contained in a chassis. For example, an information handling system may be a laptop computer, a consumer electronic device, a network storage device, or another suitable device contained in a chassis and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

Particular embodiments may be best understood by reference to FIGS. 1, 2A-2C, 3A-3B and 4A-4B, wherein like numbers are used to indicate like and corresponding parts.

Figure 1:
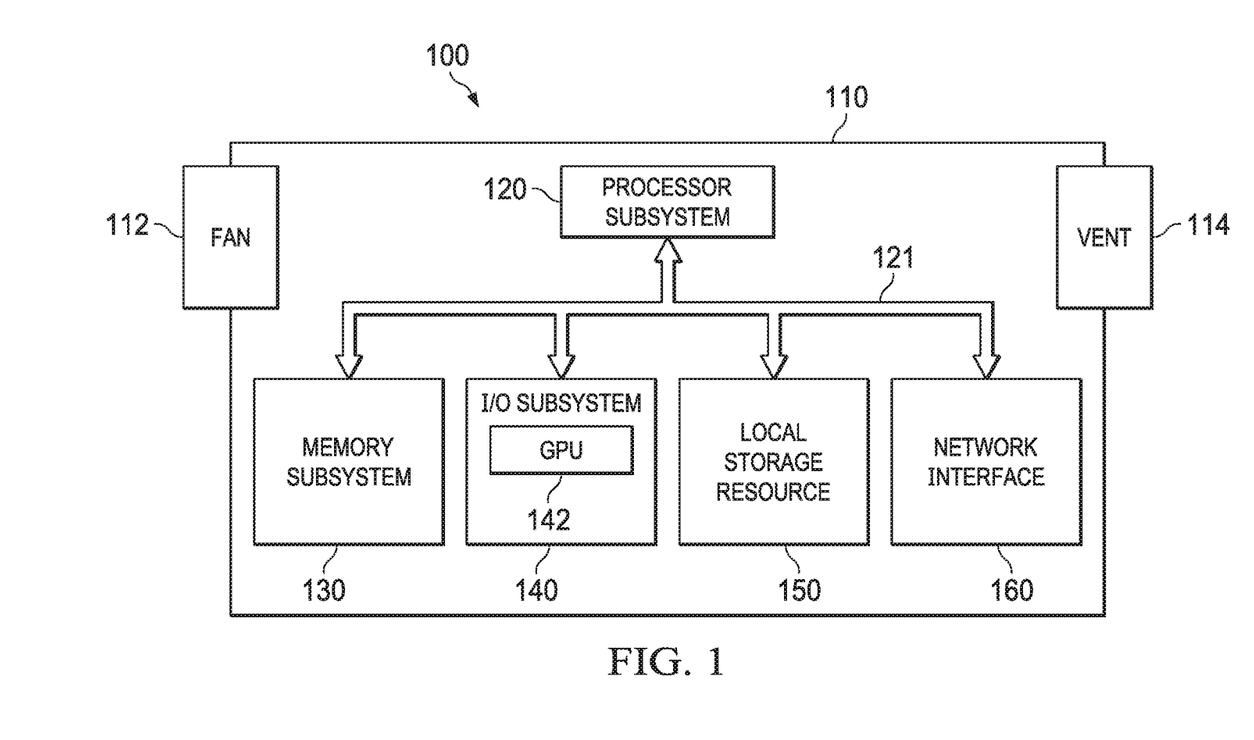
FIG. 1 is a block diagram of selected elements of an embodiment of an information handling system.

Turning now to the drawings, FIG. 1 illustrates a block diagram depicting selected elements of an embodiment of an information handling system 100 in a chassis 110 with main fan 112 for generating an airflow through chassis 110.

As shown in FIG. 1, components of information handling system 100 may include, but are not limited to, processor subsystem 120, which may comprise one or more processors, and system bus 121 that communicatively couples various system components to processor subsystem 120 including, for example, a memory subsystem 130, an I/O subsystem 140 with graphics processing unit (GPU) 142 for processing information, local storage resource 150 and a network interface 160.

As depicted in FIG. 1, processor subsystem 120 may comprise a system, device, or apparatus operable to interpret and execute program instructions and process data, and may include a microprocessor, microcontroller, digital signal processor (DSP), application specific integrated circuit (ASIC), or other digital or analog circuitry configured to interpret and execute program instructions and process data. In some embodiments, processor subsystem 120 may interpret and execute program instructions and process data stored locally (e.g., in memory subsystem 130). In the same or alternative embodiments, processor subsystem 120 may interpret and execute program instructions and process data stored remotely (e.g., in a network storage resource).

System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

Also, in FIG. 1, memory subsystem 130 may comprise a system, device, or apparatus operable to retain and retrieve program instructions and data for a period of time (e.g., computer-readable media). Memory subsystem 130 may comprise random access memory (RAM), electrically erasable programmable read-only memory (EEPROM), a PCM-CIA card, flash memory, magnetic storage, opto-magnetic storage or a suitable selection or array of volatile or non-volatile memory that retains data after power is removed.

In information handling system 100, I/O subsystem 140 may comprise a system, device, or apparatus generally operable to receive and transmit data to, from or within information handling system 100. I/O subsystem 140 may represent, for example, a variety of communication interfaces, graphics interfaces for communicating with a display, video interfaces, user input interfaces, and peripheral interfaces. I/O subsystem 140 may include more, fewer, or different input/output devices or components.

Local storage resource 150 may comprise computer-readable media (e.g., hard disk drive, floppy disk drive, CD-ROM, and other types of rotating storage media, flash memory, EEPROM, or another type of solid-state storage media) and may be generally operable to store instructions and data. For the purposes of this disclosure, computer-readable media may include an instrumentality or aggregation of instrumentalities that may retain data and instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and flash memory, such as a solid-state drive (SSD) comprising solid-state flash memory; as well as communications media such as wires, optical fibers, microwaves, radio waves, and other electromagnetic or optical carriers; or any combination of the foregoing.

Still referring to FIG. 1, network interface 160 may be a suitable system, apparatus, or device operable to serve as an interface between information handling system 100 and a network (not shown). Network interface 160 may enable information handling system 100 to communicate over a network using a suitable transmission protocol or standard. In some embodiments, network interface 160 may be communicatively coupled via a network to a network storage resource (not shown). A network coupled to network interface 160 may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and messages (generally referred to as data). A network coupled to network interface 160 may transmit data using a desired storage or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, Advanced Technology Attachment (ATA), Serial ATA (SATA), Advanced Technology Attachment Packet Interface (ATAPI), Serial Storage Architecture (SSA), Integrated Drive Electronics (IDE), or any combination thereof. A network coupled to network interface 160 or various components associated therewith may be implemented using hardware, software, or any combination thereof.

During operation of information handling system 100, components generate heat in performing the processes or purposes as mentioned above and require cooling. One approach to cooling information handling systems 100 comprises one or more main fans 112 generating an airflow through chassis 110. As depicted in FIG. 1, one or more fans 112 in a main set of fans 112 may be positioned on one side of chassis 110 and a vent 114 may be positioned on an opposite side of chassis 110 such that airflow enters chassis 110 on the first side and flows in a first direction through chassis 110 to vent 114 on the opposite side.

The cooling system depicted in FIG. 1 provides general cooling of chassis 110 and components of information handling system 100 contained in chassis 110. However, operating temperatures for components of information handling system 100 may vary based on power supplied to the component. For example, power dissipation from high end graphics cards with GPUs 142 may be approximately 250 Watts, and information handling system 100 may have multiple graphics cards. Accordingly, in an information handling system 100, a low volume of airflow generated by main fan 112 may provide insufficient cooling of all components, such that a component may be damaged and/or heat may build up in chassis 110. However, increasing the volume of airflow requires more power to fan 112, and a higher fan speed may result in increased acoustic noise. A typical approach is to operate a component at a lower power level, which may be frustrating to a user.

Embodiments of a cooling system for information handling system 100 may a main fan 112 to generate a main airflow in chassis 110. Embodiments of a cooling system for information handling system 100 may also comprise one or more circuit board cooling systems to cool components on individual circuit boards. Each circuit board cooling system comprises a vapor chamber to distribute heat over a large area, two heatsinks positioned on opposite ends of the vapor chamber, and a fan for generating two airflows in opposite directions for parallel cooling of the two heatsinks.

Figure 2A:
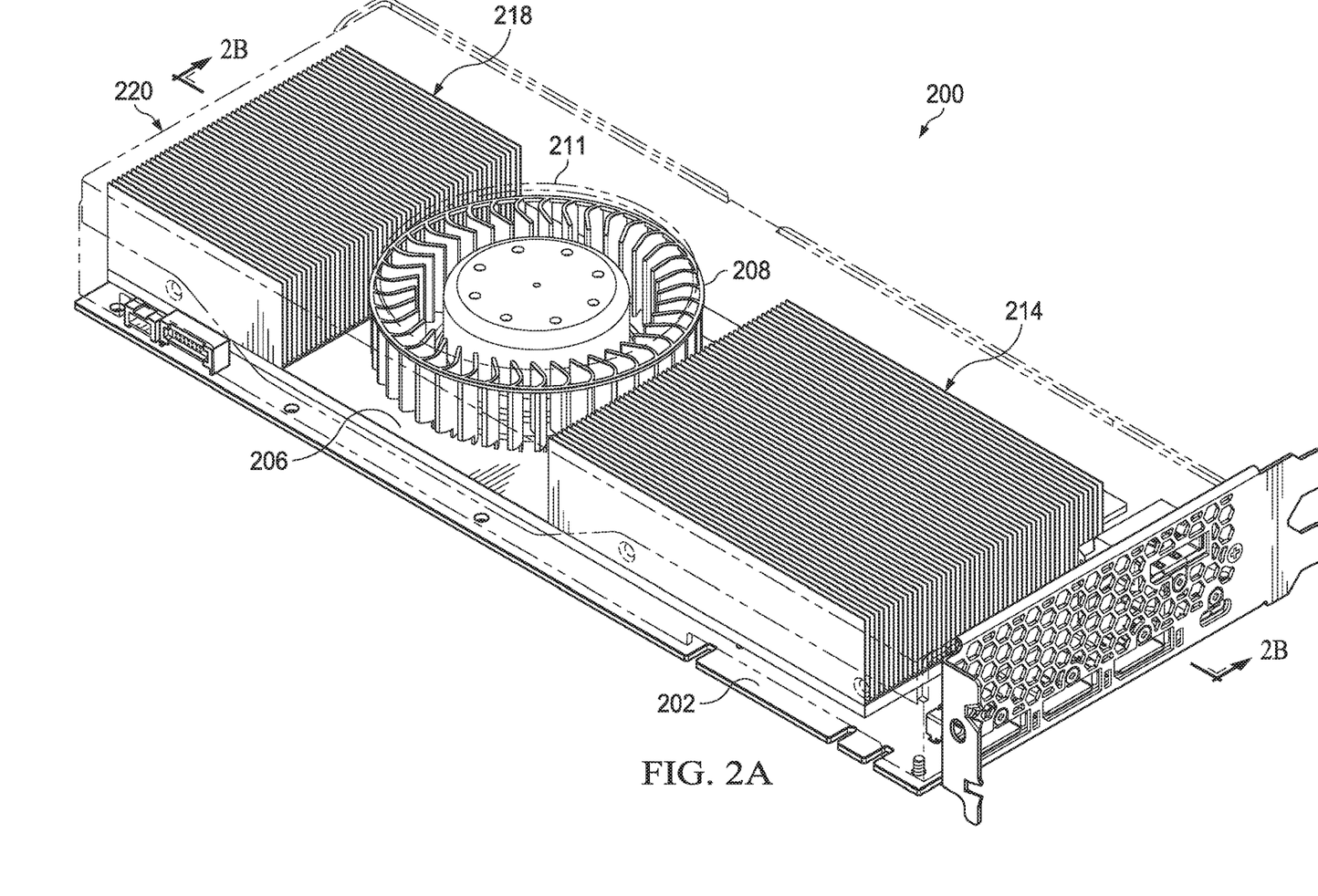
FIGS. 2A-2C are perspective, side and top views of an example graphics card assembly for an information handling system with one embodiment of a system for cooling a set of components on a circuit board.
Figure 2B:
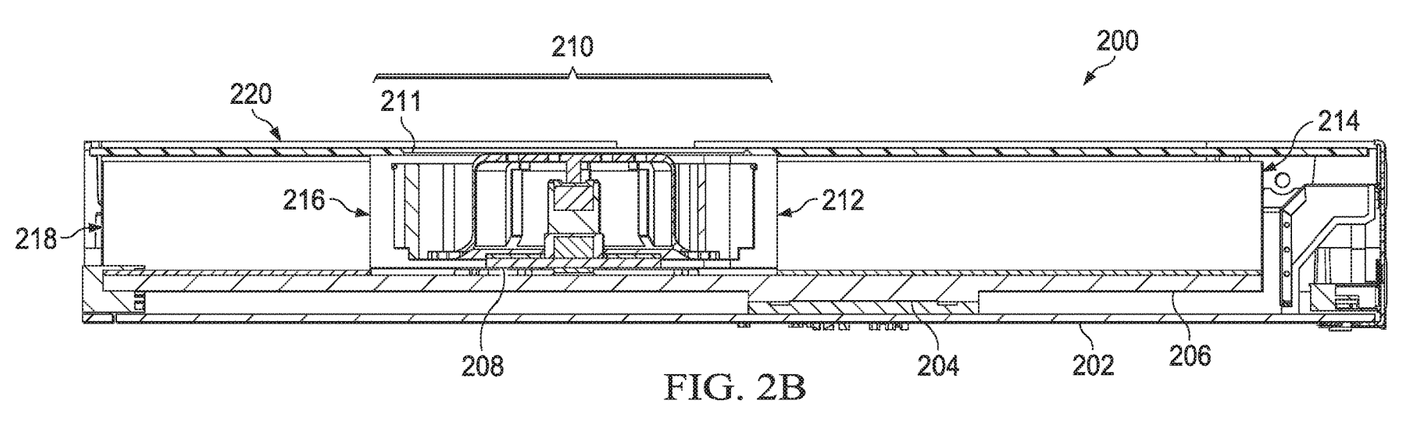
Figure 2C:
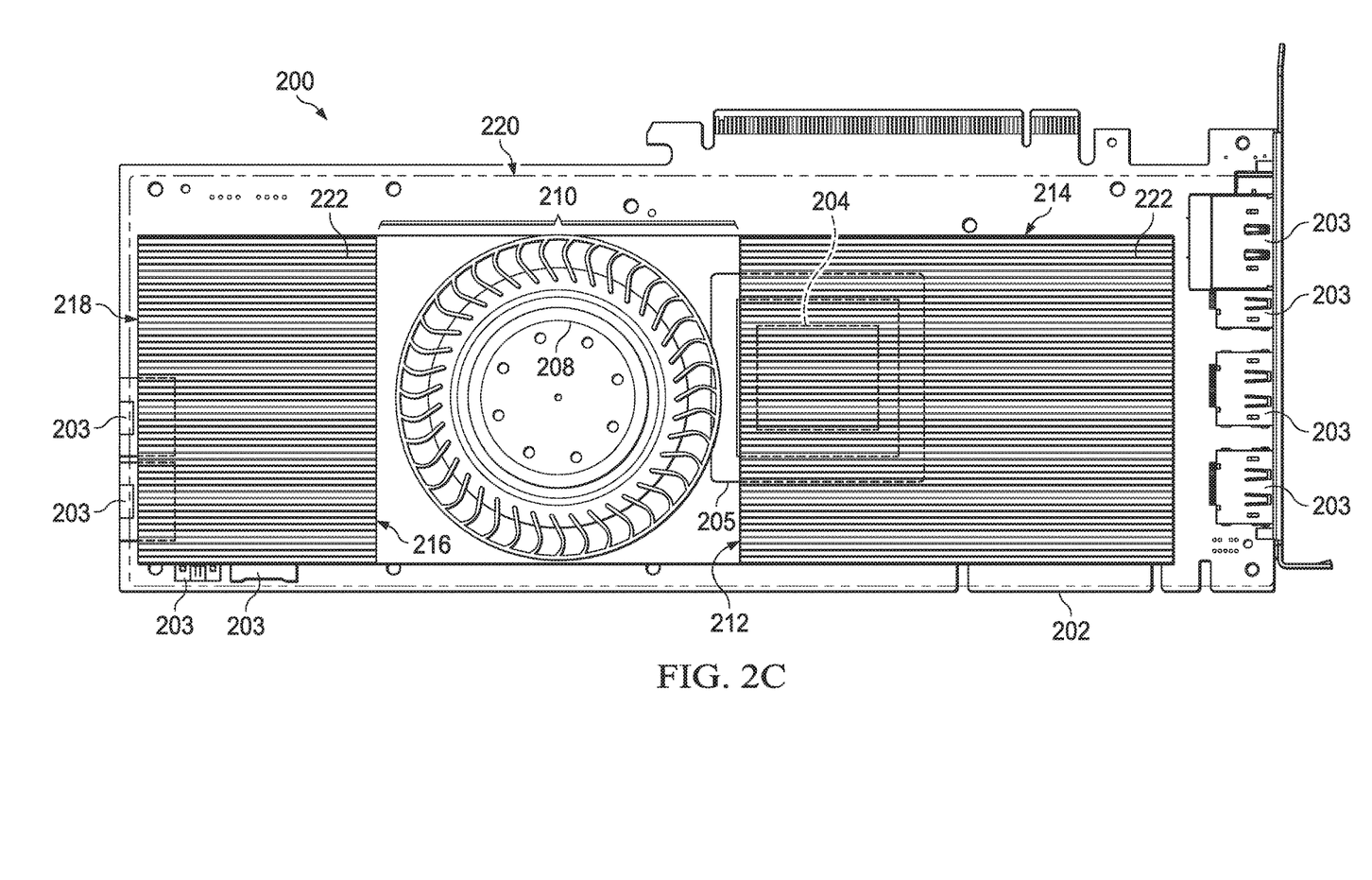

Referring to FIGS. 2A-2C, embodiments of circuit board cooling system 200 may cool one or more components 204 on circuit board 202.

Referring to FIG. 2A, embodiments of a cooling system for circuit board 202 may comprise vapor chamber 206 for distributing heat over a large surface area, fan inlet 211 for receiving air, fan 208 for generating airflow for cooling a first heatsink 214 on a first side of fan 208 and a second heatsink 218 on an opposite side of fan 208. Circuit board cooling system 200 may be contained within housing 220. Each of first heat sink 214 and second heatsink 218 comprise a plurality of fins 222.

Referring to FIGS. 2A-2C, circuit board 202 comprises one or more components 204 capable of generating heat. For ease of understanding, embodiments may be described relative to a single component 204 generating heat. However, embodiments disclosed herein may cool multiple heat-generating components 204 on circuit board 202. Component 204 may be located at different locations on circuit board 202. For example, as depicted in FIG. 2B component 204 may be located off center relative to a length of circuit board 202. As depicted in FIG. 2C, component 204 may be located off center relative to a length of circuit board 202 and located off center relative to a width of circuit board 202, and component 204 may be mounted on a cooling plate or other intermediate surface 205.

Vapor chamber 206 may refer to a heat transfer system in which a fluid and a wicking material are contained in a chamber formed between an evaporator plate and a condenser plate such that the heat generated by a component 204 is distributed over a larger surface area. The evaporator plate may form a first side of vapor chamber 206 for contact with component 204 on circuit board 202. Vapor chamber 206 contains a fluid that, when heated by component 204, changes from a liquid to a vapor and moves in all directions throughout vapor chamber 206. The condenser plate may form a second side of vapor chamber 206 for contact with heatsinks 214 and 218. When the vapor transfers heat to heatsinks 214 and 218, the vapor cools and becomes liquid again, and the wicking material distributes the liquid throughout vapor chamber 206.

In some embodiments, vapor chamber 206 is formed with a length and a width relative to circuit board 202. Circuit board 202 may have an overall length (e.g., 317 mm), but may have a smaller usable length (e.g., 260 mm). For example, as visible in FIG. 2C, circuit board 202 may have a usable length to allow room for cable routing and connectors 203. Similarly, circuit board 202 may be formed with an overall width (e.g., 120 mm) but have a smaller usable width (e.g., 100 mm) due to connectors 203.

Fan 208 may have a diameter approximately equal to a usable width of circuit board 202. For example, in some embodiments, for a circuit board 202 with a usable width of 100 mm, fan 208 may have a diameter of approximately 100 mm. Fan 208 may be positioned on circuit board 202 based on the design of chassis 110 or the location of circuit board 202 in chassis 110. For example, the position of fan 208 may depend on the location of circuit board 202 in relation to main fan 112 or vent 114 in chassis 110. In some embodiments, fan 208 may be positioned on circuit board 202 relative to component 204, relative to a midpoint of vapor chamber 206 or relative to a midpoint of circuit board 202. In some embodiments, as depicted in FIG. 2C, fan 208 may be located off-center relative to a length of circuit board 202, off-center relative to vapor chamber 206 and located to overlap a portion of component 204.

Fan housing 210 comprises fan inlet 211 for receiving air into fan 208 and is located between first heatsink 214 and second heatsink 218 on opposite sides of fan 208. During operation, fan 208 draws air through fan inlet 211 into fan housing 210 and generates airflow, wherein fan housing 210 is configured to direct a first airflow in a first direction out first fan outlet 212 to cool first heatsink 214 and direct a second airflow in a second direction out second fan outlet 216 to cool second heatsink 218 in parallel. The dimensions of first fan outlet 212 and second fan outlet 216 may be equal such that the first airflow and the second airflow are substantially equal.

First heatsink 214 may be coupled to vaper chamber 206 and positioned proximate to first fan outlet 212 and second heatsink 218 may be coupled to vapor chamber 206 and positioned proximate to second fan outlet 216. First heatsink 214 and second heatsink 218 may be the same size or different sizes. In some embodiments, as depicted in FIGS. 2A-2C, first heatsink 214 may be larger than second heatsink 218.

During operation of information handling system 100, component 204 on circuit board 202 may generate most of the heat. For example, in some graphics cards with multiple heat-generating components 204, a single component 204 of processor subsystem 120 or GPU 142 depicted in FIG. 1 may generate over 90% of the heat associated with circuit board 202.

Contact between component 204 and vapor chamber 206 allows heat transfer from component 204 to vapor chamber 206. Vapor chamber 206 may be configured with a surface area equal to a usable length and a usable width of circuit board 202. Vapor chamber 206 may be configured with a fluid and a wicking material such that heat is constantly distributed throughout vapor chamber 206. Vapor chamber 206 may be in contact with first heatsink 214 and second heatsink 218 such that a first portion of the heat is transferred to first heatsink 214 and a second portion of the heat is transferred to second heatsink 218.

Fan 208 may operate to generate airflow and fan housing 210 may be configured to direct a first airflow across first heatsink 214 and direct a second airflow across second heatsink 218, wherein circuit board cooling system 200 may use heatsinks 214, 218 for parallel cooling of component 204 and circuit board 202.

Parallel Cooling

Figure 3A:
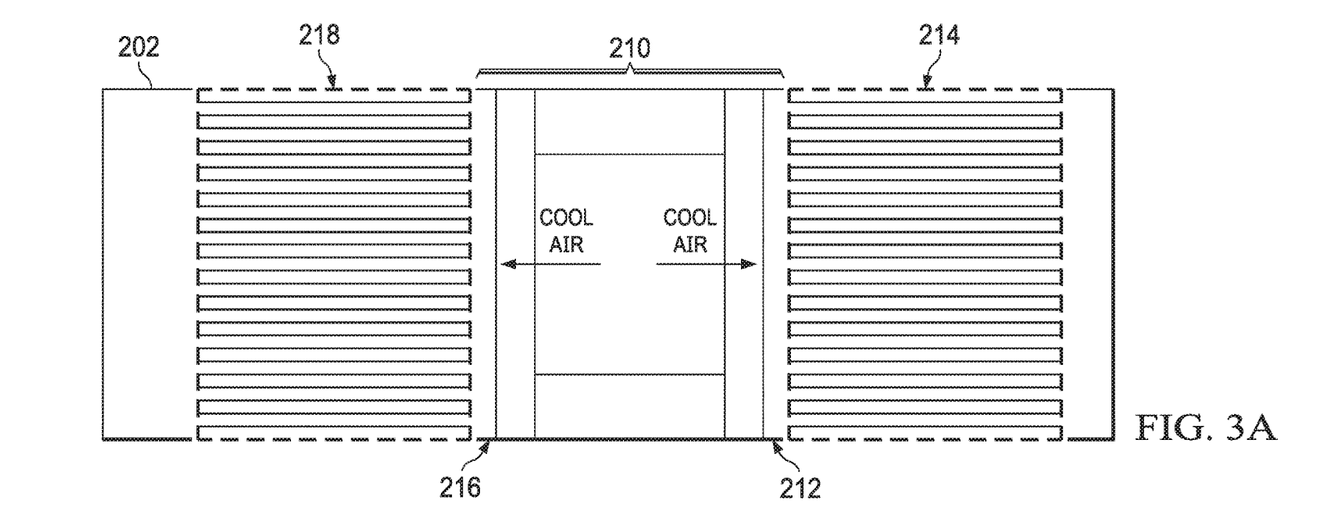
FIG. 3A is a top view of one embodiment of a system for parallel cooling a set of components on a circuit board using a fan with dual opposed outlets and two heatsinks on opposite sides of the fan.
Figure 3B:
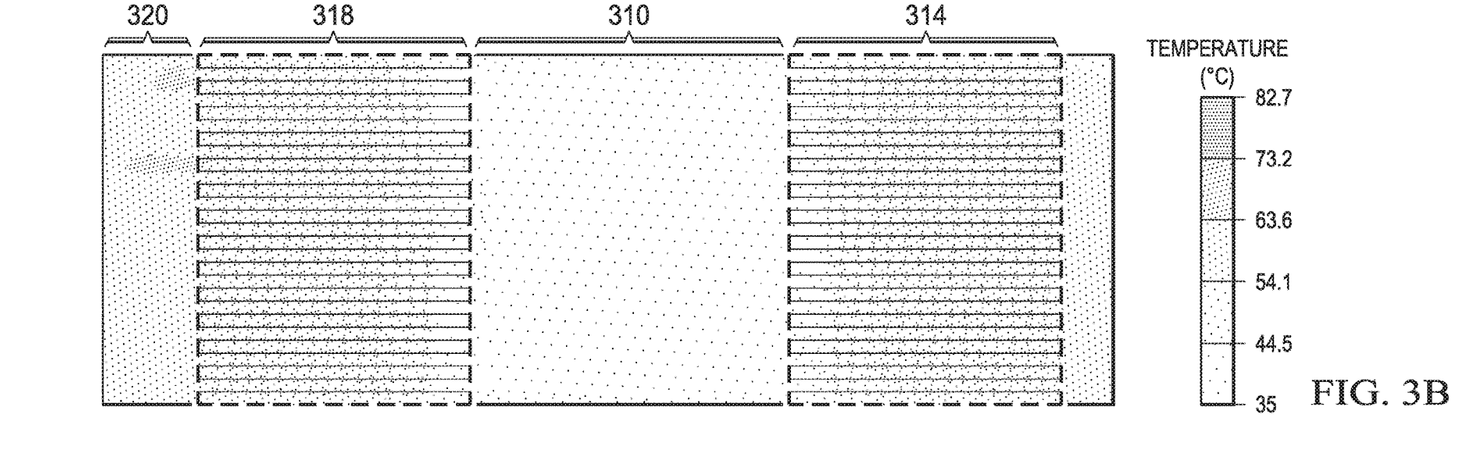
FIG. 3B is an image of a simulated temperature profile associated with the system for cooling a set of components on a circuit board depicted in FIG. 3A.

For a better understanding of parallel cooling of components 204 on circuit boards 202, FIGS. 3A-3B depict a top view of one embodiment of a circuit board cooling system comprising a fan (not shown) in a fan housing 210 configured with dual opposed outlets 212 and 216 and an image of a simulated temperature profile of the circuit board cooling system.

FIG. 3A depicts a top view of one embodiment of circuit board cooling system 200 configured with fan housing 210 positioned between first heatsink 214 and second heatsink 218. A vapor chamber 206 (not visible) may distribute heat from a component (not visible) across an area under fan housing 210, first heatsink 214 and second heatsink 218. A fan such as fan 208 depicted in FIGS. 2A-2C may operate to generate an airflow with a pressure of 0.4 inches H₂O and fan housing 210 may direct a first airflow of cool air at 15 CFM (cubic feet per minute) in a first direction direct a second airflow of cool air (also 15 CFM) in a second direction opposite the first direction, for a total airflow of 30 CFM. The first airflow may cool first heatsink 214 and the second airflow may cool second heatsink 218. First heatsink 214 and second heatsink 218 may have the same number of fins (e.g., 47) and have substantially equal overall dimensions (e.g., 90 mm×70 mm×26 mm).

As depicted in FIG. 3B, for component 204 operating at 250 W, a temperature profile of area 310 associated with fan housing 210 may be approximately 35 C and the temperature profiles of first heatsink 214 and second heatsink 218 may be substantially equal at approximately 72 degrees C. Thus, embodiments of circuit board cooling system 200 cooling heatsinks 214, 218 in parallel prevent heated air exiting first heatsink 214 from affecting second heatsink 218. FIG. 3B depicts circuit board cooling system 300 may be configured with fan 208 positioned relative to a midpoint of vapor chamber 206. However, vapor chamber 206 may distribute heat across a large surface area such that components 204 on circuit board 202 may operate with lower temperature profiles even if fan 208 is at a position on vapor chamber 206 other than the midpoint.

Parallel Cooling vs Serial Cooling

Figure 4A:
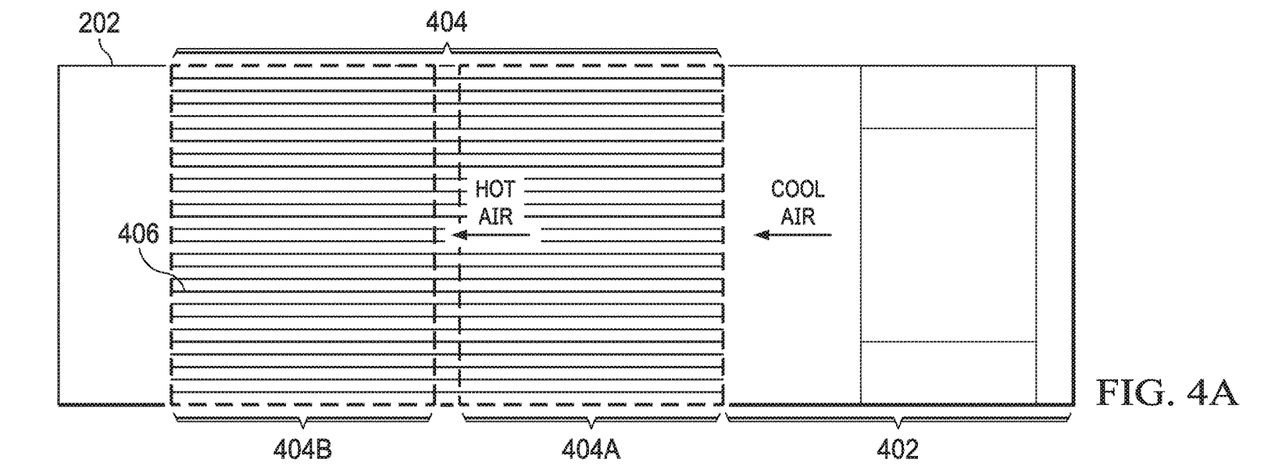
FIG. 4A is a top view of a system for cooling a set of components on a circuit board using a fan with a single outlet and two heatsinks in series.

Embodiments of circuit board cooling systems in a parallel cooling configuration may cool components 204 more efficiently than a cooling system in a serial configuration. FIG. 4A depicts a top view of an example cooling system configured for serial cooling with fan housing 210 positioned near one end of heatsink 404 positioned on circuit board 202. A single heatsink 404 have a set of fins (e.g., 47 fins) and heatsink 404 may have overall dimensions of 90 mm×140 mm×26 mm such that heatsink 404 may be represented as two heatsinks 404A, 404B equal to heatsinks 214, 218 depicted in FIG. 3A. Fan 402 may generate a single airflow of cool air at 30 CFM with a pressure of 0.4 inches $H_2O$, which are equal to the volume and pressure of the airflow generated by fan 208 depicted in FIG. 3A.

Figure 4B:
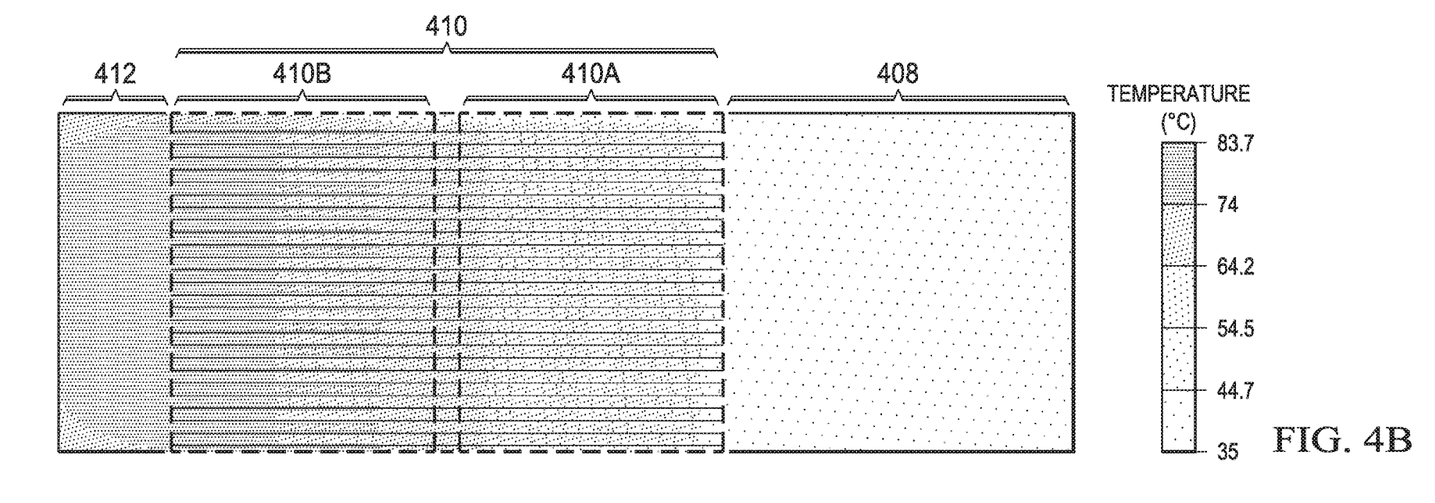
FIG. 4B is an image of a simulated temperature profile associated with the system for cooling a set of components depicted in FIG. 4A.

As depicted in FIG. 4B, for component 204 operating at 250 W, a temperature profile of area 408 corresponding to fan 402 may be approximately 35 C, which is approximately equal to the temperature profile of area 310 corresponding to fan 208 in FIG. 3B. Also, a temperature profile of area 410A associated with first portion 404A of heatsink 404 may be approximately 72 degrees C., indicating airflow from fan 402 may remove heat from first portion 404A. However, hot air exiting first portion 404A passing through second portion 408B heatsink 404 may not be effective at removing heat resulting in downstream portion 408B. After a certain point, heated air passing through a fin channel may increase the temperature of fins 406 such that a temperature difference between the fin 406 and passing airflow is so small that very little heat is transferred from fin 406 to the air. As a result, a temperature profile of area 410B corresponding to second portion 404B of heatsink 404 may be approximately 83 degrees C., which is approximately 11 C hotter. Furthermore, the temperature of second area 410B may high enough such that extending heatsink 404 to cover area 412 near the end of circuit board 202 may not provide any additional cooling.

Furthermore, the junction to air thermal resistance associated with two smaller heatsinks 216, 218 may be less than the junction to air thermal resistance associated with a single large heatsink 408. For example, the ratio of junction temperature ($T_{JUNCTION}$) to air thermal resistance for circuit board cooling system 300 depicted in FIG. 3A may be approximately 0.15 C/Watt, which represents a 21% reduction as compared to 0.19 C/Watt for cooling system 400 depicted in FIG. 4A.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A cooling system for cooling a set of components on a circuit board, the cooling system comprising:
   a vapor chamber comprising a first side coupled to a component on the circuit board;
   a first heatsink and a second heatsink coupled to a second side of the vapor chamber, wherein the first heat sink is larger than the second heat sink and positioned relative to the component;
   a fan positioned on the second side of the vapor chamber between the first heatsink and the second heatsink, wherein the fan is positioned offset from the component, the first heatsink is on a first side of the fan and the second heatsink is on a second side of the fan opposite the first heatsink; and
   a housing configured to direct a first airflow in a first direction to the first heatsink and direct a second airflow in a second direction opposite the first direction to the second heatsink.

2. The cooling system of claim 1, wherein the fan is positioned near the middle of the circuit board.

3. The cooling system of claim 1, wherein:
   the circuit board comprises a plurality of components;
   one component in the set of components generates most of the heat associated with the circuit board; and
   the fan is positioned relative to a position of the component generating most of the heat.

4. The cooling system of claim 1, wherein the vapor chamber comprises a length approximately equal to a usable length of the circuit board and a width approximately equal to a usable width of the circuit board.

5. A chassis comprising:
   a plurality of components;
   a main fan for generating a main airflow for removing heat from the chassis; and
   a cooling system for cooling a set of components on a circuit board, the cooling system comprising:
      a vapor chamber comprising a first side coupled to the circuit board;
      a first heatsink and a second heatsink coupled to a second side of the vapor chamber, wherein the first heat sink is larger than the second heat sink and positioned relative to a component of the set of components;
      a fan positioned on the second side of the vapor chamber between the first heatsink and the second heatsink, wherein the fan is positioned offset from the component, the first heatsink is on a first side of the fan and the second heatsink is on a second side of the fan opposite the first heatsink; and
      a housing configured to direct a first airflow in a first direction to the first heatsink and direct a second airflow in a second direction opposite the first direction to the second heatsink.

6. The chassis of claim 5, wherein the vapor chamber comprises a length approximately equal to a usable length of the circuit board and a width approximately equal to a usable width of the circuit board.

7. An information handling system comprising:
   a chassis comprising a main fan for generating a main airflow for removing heat from the chassis;
   a plurality of components in the chassis; and a cooling system for cooling a set of components on a circuit board in the chassis, the cooling system comprising:
- a vapor chamber comprising a first side coupled to the circuit board;
- a first heatsink and a second heatsink coupled to a second side of the vapor chamber, wherein the first heat sink is larger than the second heat sink and positioned relative to a component of the set of components;
- a fan positioned on the second side of the vapor chamber between the first heatsink and the second heatsink, wherein the fan is positioned offset from the component, the first heatsink is on a first side of the fan and the second heatsink is on a second side of the fan opposite the first heatsink; and
- a housing configured to direct a first airflow in a first direction to the first heatsink and direct a second airflow in a second direction opposite the first direction to the second heatsink.

8. The information handling system of claim 7, wherein the vapor chamber comprises a length approximately equal to a usable length of the circuit board and a width approximately equal to a usable width of the circuit board.

* * * * *